United States Patent [19]

Perraud

[11] Patent Number: 5,339,044
[45] Date of Patent: Aug. 16, 1994

[54] HIGH LINEARITY DIFFERENTIAL CIRCUIT

[75] Inventor: Jean-Claude Perraud, St. Aubin sur Mer, France

[73] Assignee: U.S. Philips Corporation, New York, N.Y.

[21] Appl. No.: 15,109

[22] Filed: Feb. 5, 1993

[30] Foreign Application Priority Data

Feb. 19, 1992 [FR] France .................. 92 01884

[51] Int. Cl.$^5$ .............................................. H03F 3/45
[52] U.S. Cl. ...................... 330/252; 330/257; 330/288
[58] Field of Search ............ 330/252, 253, 257, 311, 330/261, 288, 307

[56] References Cited

U.S. PATENT DOCUMENTS 5,142,242 8/1992 Schaffer ..................... 330/257

*Primary Examiner*—James B. Mullins
*Assistant Examiner*—J. Dudek
*Attorney, Agent, or Firm*—Bernard Franzblau

[57] ABSTRACT

A differential circuit having a predefined voltage gain of the order of unity and with a high linearity includes a differential pair of input transistors fed by a DC current source (S) each through an emitter resistor having a resistance value R. A number p of forward biased junctions and a control branch of a current mirror are inserted in the emitter path of each of the input transistors to the current source. The output branch of each current mirror feeds a respective output resistor in series with a number k of forward biased junctions. A voltage gain of $k/2(2+p)$ is obtained when the value of the output resistors is selected to be equal to $k.R/(2+p)$. At the same time, compensation is provided for the linearity errors of the input transistors.

15 Claims, 2 Drawing Sheets

HIGH LINEARITY DIFFERENTIAL CIRCUIT

BACKGROUND OF THE INVENTION

The present invention relates to a high linearity differential circuit, comprising a DC current source feeding from a supply voltage reference terminal the emitter-collector paths of a differential pair of input transistors, the collector of each of these input transistors being fed from another supply voltage terminal, the base receiving an input voltage signal and the emitter being connected to the DC current source via an emitter load resistor which has the value R, practically identical for each of the input transistors.

A differential circuit of this type forms the basis of the greater part of the input stages of prior-art differential amplifiers in which an output signal of such a stage may be tapped either from the emitter load resistors or also from paired impedances inserted in the connection between the collectors of the transistors of the differential pair and said other supply terminal.

One particular object of the invention is to provide an integrable differential circuit whose gain, which is close to unity (or less than that), is well defined and reproducible, and in which the linearity of the output signal relative to the input signal is satisfied to better than 1%. A circuit having a differential voltage gain equal to 1 is known from the article entitled: "A 10-b 75-MSPS Subranging A/D Converter with Integrated Sample and Hold"—Reinhard Petschacher et al.—published in IEEE Journal of Solid-State Circuits, Vol. 25, No. 6, December 1990. This circuit has a linearity compensation as a result of a forward biased junction inserted in the connection from the collector of each of the input transistors to the supply voltage terminal.

The known circuit has the disadvantage that the output amplitude is considerably limited.

A differential circuit having little gain and a high linearity is sought in analog signal measuring means and, for example, in analog-to-digital converters.

Another prior-art way of obtaining the desired result consists of utilizing an operational amplifier to which substantial feedback is applied so as to determine the desired gain, but this solution is not entirely satisfactory because of the limitation of the pass-band and/or the power consumption and also from the point of view of the complexity of the circuit, thus of the surface area the semiconductor requires and, consequently, of its relatively high price.

SUMMARY OF THE INVENTION

One of the objects of the invention is to provide a high linearity differential circuit which has a less complex structure than that using an operational amplifier and of which the performance, as regards the pass-band and power consumption, is more satisfactory.

Another object of the invention is to improve the linearity of a differential circuit which comprises a pair of input transistors, and, more particularly, for input signals having a considerable voltage swing of the order of one volt or more, while retaining a large pass-band, a large output voltage swing and a relatively low power consumption.

According to the invention such objects are achieved by means of a circuit in accordance with the introductory paragraph, characterized in that a control branch of a current mirror, comprising q forward biased junctions, is inserted between the emitter of each input transistor and the current source, in that an output branch of the current mirror is connected to said other supply terminal via an output load resistor in series with a non-zero number k of forward biased junctions, and in that the value of each of the output load resistors is selected to be practically equal to $k.R/(1+q)$ so as to obtain in this manner a voltage gain at the output, which gain is equal to $k/(1+q)$ relative to the input voltage signal.

For a current mirror having a single DC junction ($q=1$) the voltage gain of such a circuit may be selected from the values of: $\frac{1}{2}$, 1, $1\frac{1}{2}$ ... depending on whether the number k of junctions used is equal to 1, 2, 3, ... respectively. The most interesting applications are a selected gain equal to $\frac{1}{2}$ or 1 for which the voltage swing of the output signal is only slightly limited by the insertion of the junctions and the corresponding voltage jump.

Other discrete gain values may also be obtained in a similar embodiment of the invention, characterized in that a number p of forward biased junctions in series with the control branch of the current mirror are inserted between the emitter of each input transistor and the current source, and in that the value of each of the output load resistors is selected to be practically equal to $k.R/(1+p+q)$ so that at the output a voltage gain equal to $k/(1+p+q)$ is obtained.

In this manner one may obtain, for example, a gain of $\frac{1}{3}$ or $\frac{2}{3}$ by selecting $p=1$ and $k=1$ or $k=2$.

For all of the cases the linearity of the output signal is ensured because the emitter current of each input transistor, influenced by a non-linear component relative to the input voltage, is recopied in the output branch of each current mirror, where the current mirror produces an output voltage on the output load resistor increased by the voltage of the k forward biased junctions, these elements being conveniently proportioned for obtaining a voltage compensation for the non-linear current component.

The circuit according to the invention presents the advantage, owing to the use of current mirrors, of having a possibly larger output voltage swing than that of a circuit in which the output signal would be taken from a collector load of the transistors of the input transistor pair.

The circuit according to the invention continues to have a very simple structure that is easy to integrate and it may be supplied with a relatively small current while a large pass-band is maintained, in essence, determined by the cut-off frequency of the transistors used.

For maintaining the possibility of a large voltage swing at the input, the circuit according to the invention preferably uses current mirrors of known, highly simple structure, that is to say, comprising only one transistor arranged as a diode in the control branch. In this type of current mirror a small error in the recopying of the control current occurs because the value of the base current of one of the transistors in the current mirror is not recopied in the output branch.

A partial correction of this small error, which correction is known per se, may be applied to the circuit according to the invention in an embodiment which is characterized in that, in each of the current mirrors said control branch comprises a control transistor arranged as a diode, the emitter of this control transistor being connected to the DC current source through a current compensating resistor, while the output branch of the current mirror comprises a transistor whose emitter is directly connected to the DC current source.

The value of the compensating resistor is determined by means of a simple calculation for which the maximum input voltage swing provided for the circuit is taken into consideration.

In practice it has been noticed in an embodiment in which the gain was provided to be ½, that the linearity of the output signal was ensured to within 1/1000 for a 1-volt input signal applied symmetrically. However, for a non-symmetrical input signal, the linearity was slightly less favourable and ensured only to within 5/1000.

This difference in performance, depending on the way the input signal is applied, is basically the result of the Early effect presented by the transistors of the differential pair at the input.

This small error may still be practically eliminated according to another embodiment of the invention, characterized in that in each of the current mirrors said output branch comprises a cascode stage constituted by an additional transistor whose base is biased with the aid of a voltage shift determined relative to the node constituted by the DC current source and the current mirrors, whose collector feeds the output load resistor in series with the determined number k of junctions, and whose emitter is connected to the collector of the output branch transistor of the current mirror.

According to this embodiment, the insertion of an additional voltage drop in the output branch of the current mirrors is not inconvenient in all of the cases where the sought gain is in the neighbourhood of unity or less.

Experience has shown that in this case the linearity of the output signal was thus ensured to within 1/1000, or better, even for a 1-volt input signal applied non-symmetrically.

BRIEF DESCRIPTION OF THE DRAWING

The following description relating to the annexed drawings is given by way of non-limiting example and will make it better understood what the invention consists of and how it may be realised.

DESCRIPTION OF THE PREFERRED EMBODIMENTS

Figure 1:
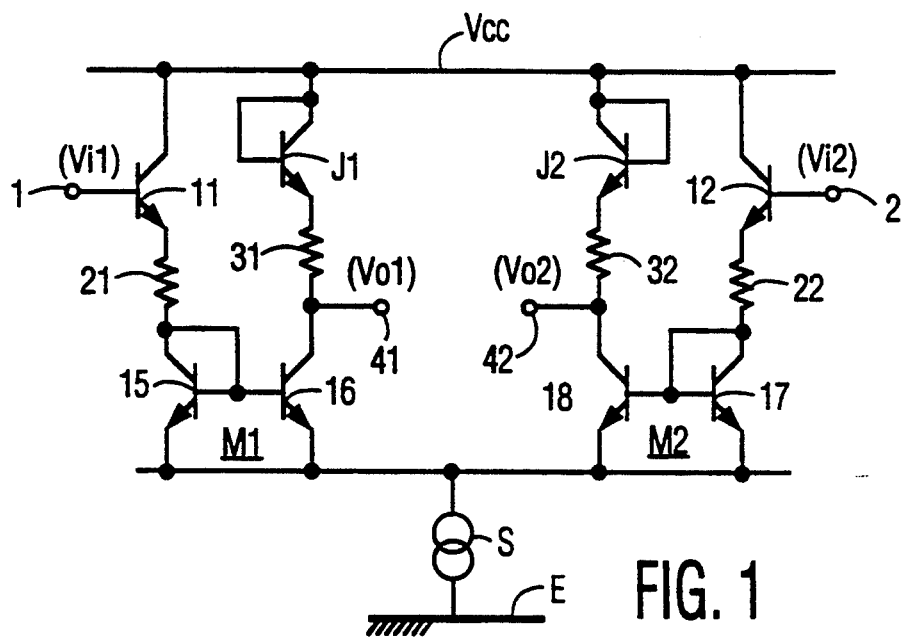
FIG. 1 shows the electrical circuit diagram of a differential circuit according to the simplest embodiment of the invention, in which the voltage gain is equal to ½.

The electrical circuit diagram of a first example of high linearity differential circuits according to the invention is represented in FIG. 1.

A DC current source S feeds from a supply voltage reference terminal E the emitter-collector path of a differential pair of input transistors 11 and 12 respectively. The collector of each of these transistors 11 and 12 is connected directly to another supply voltage terminal $V_{cc}$. The base receives an input voltage signal $V_{i1}$ and $V_{i2}$ respectively, on the respective input terminals 1 and 2 and the emitter is connected to the DC current source S via an emitter load resistor 21, 22, respectively, of the same value R.

According to the invention, a control branch of a current mirror M1, M2, of which the output branch is connected to said other supply terminal $V_{cc}$ via an output load resistor 31, 32 respectively, in series with a respective forward biased junction $J_1$, $J_2$, is inserted between the emitter of each input transistor 11, 12 and the DC current source S. Each of the current mirrors M1, M2 is simply constituted by an input transistor 15, 17 arranged as a diode, coupled by means of its base to an output transistor 16, 18, the output branches of these current mirrors supplying a current substantially equal to the control current at the input of these current mirrors.

A differential voltage output signal $V_{01}$, $V_{02}$ is tapped from the terminals 41 and 42 respectively, connected to the respective nodes between the collectors of the output transistors of the current mirrors M1 and M2 and their respective loads formed by the series branch of the output load resistors 31, 32 and the junctions $J_1$, $J_2$, respectively.

This arrangement makes it possible to obtain an output voltage gain relative to the input voltage which is substantially equal to ½ when the value of the resistors 31 and 32 is selected to be equal to R/2.

Under these conditions the voltage linearity of the output signal is ensured because in each of the paths of the differential circuit the emitter current of each of the input transistors is determined differently on the basis of the input voltage via the emitter load resistor having the value R and also via the non-linear impedances of two junctions, the base-emitter junctions of the input transistors 11, 12 and the junctions of the control branch of the current mirrors M1, M2 (transistors 15, 17). This emitter current is recopied in the output branch of each of the current mirrors M1, M2 and develops a voltage relative to the supply voltage $V_{cc}$ which is determined via the output load resistors 31, 32 and also via the non-linear impedances of the junctions $J_1$ and $J_2$. Because the sum of the output impedances is exactly equal to half the input impedance, the gain is thus equal to ½ and the effect of the non-linear impedances is substantially eliminated.

The invention is not restricted to a differential gain circuit having a gain of ½ but, in contrast, permits the selection of different discrete voltage gain values by applying the same basic idea.

Figure 2:
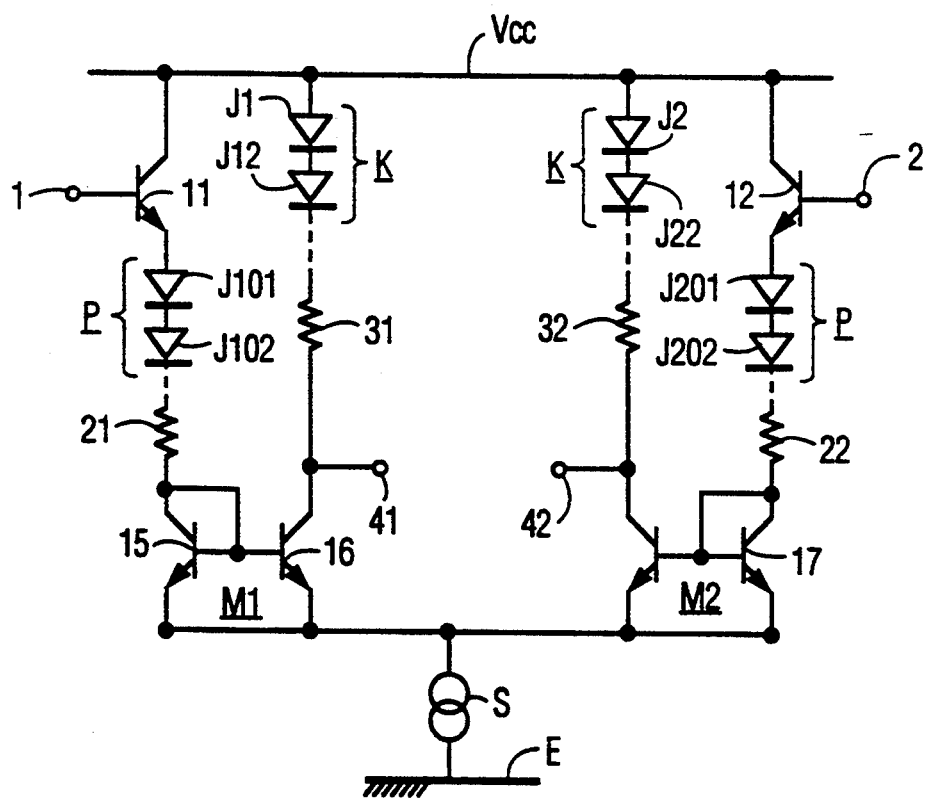
FIG. 2 shows the electrical circuit diagram of a circuit according to an embodiment of the invention, in which the gain may be selected to be among various discrete values.

FIG. 2 shows the circuit diagram of a differential circuit according to the invention for which the gain may be selected from a variety of discrete values. In this drawing Figure the elements having like functions to those of FIG. 1 are given like reference characters. Compared with the circuit shown in FIG. 1, the circuit shown in FIG. 2 is distinguished by the insertion of additional junctions all forward biased either in the control branches of the current mirrors M1 and M2 as additional input loads, or in the output branches of the same current mirrors, or also in the two branches. More precisely, when k junctions are inserted such as $J_1$, $J_{12}$ ... $J_2$, $J_{22}$ ..., a value for the output load resistor 31, 32 equal to k.R/2 is selected, and at the output a gain is thus produced having the value k/2. On the other hand, if a number p of forward biased additional junctions are inserted in series with the control branch of the current mirrors M1 and M2, such as $J_{101}$, $J_{102}$ ..., $J_{201}$, $J_{202}$, ..., the value of each output load resistor 31, 32 is then selected to equal to k.R/(2+p) and the voltage gain of the circuit becomes equal to $k/(2+p)$. For example, if a junction $J_{101}, J_{201}$ is inserted in the control branch of the current mirrors M1, M2 (p=1), whereas if two junctions are inserted in each of the output branches of the current mirrors, $J_1, J_{12}, J_2, J_{22}$ (k=2), a $\frac{2}{3}$ gain is obtained with compensation for the non-linear impedances when the output load resistors 31, 32 have a value of 2R/3. In the examples described, the current mirrors M1 and M2 are of a most simple type in which the control branch inserts only a single forward biased junction (diode-arranged transistors 15 and 17). Other types of current mirrors can also be used, which insert q forward biased junctions, with q>1. In this case the output load resistors 31 and 32 have a selected value equal to $k.R(1+p+q)$ and the gain obtained becomes: $k/(1+p+q)$.

It will be evident that in the case where the supply voltage $V_{cc}$ is relatively small (5 volts), the differential circuit as shown in FIG. 2 is particularly interesting when the numbers p and k of inserted junctions remain low, so that the voltage swing of the input and output signals is not additionally restricted in an exaggerated manner by the voltage at which the junctions are additionally inserted compared with the circuit shown in FIG. 1.

The circuits shown in FIGS. 1 and 2 present an excellent output voltage linearity, more particularly, when the input voltage is applied symmetrically and this up to an input peak voltage of 1 volt. In the non-symmetrical drive mode, such a circuit performs less well and causes a linearity error of the order of 5/1000. Small residual errors can be compensated for in a simple manner in an embodiment of the invention represented in FIG. 3.

Figure 3:
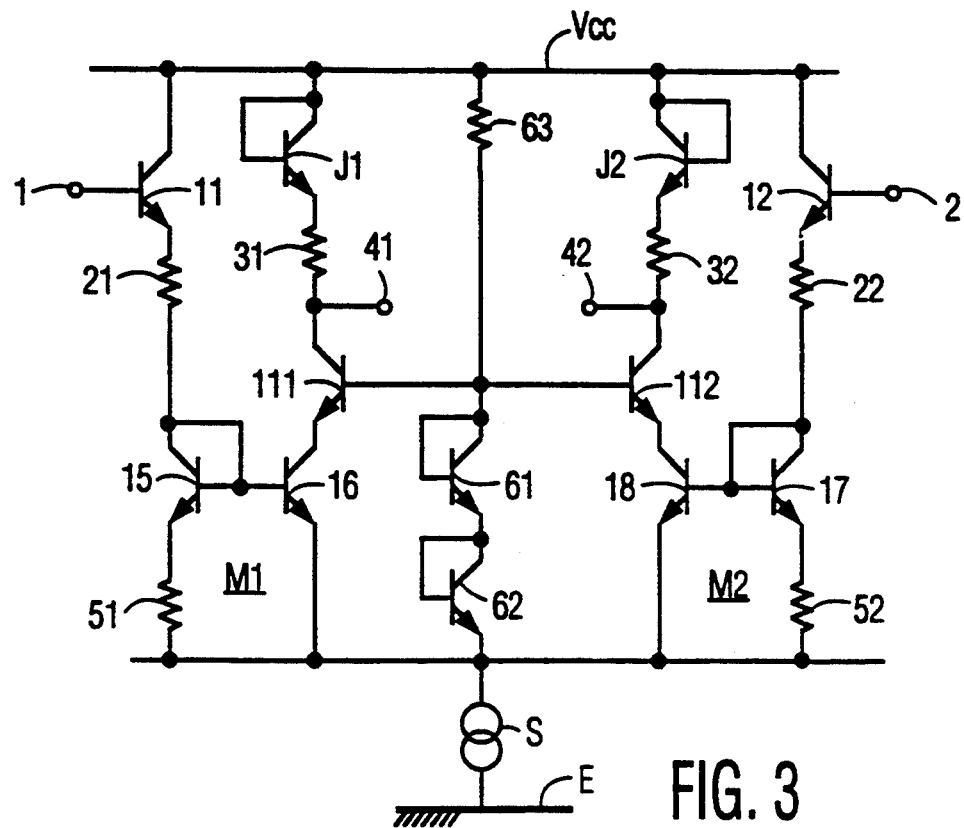
FIG. 3 shows the circuit diagram of a circuit according to the invention, comprising a plurality of additional compensation means for the residual linearity errors.

FIG. 3 presents the circuit diagram of a differential circuit having a gain of $\frac{1}{2}$, similar to the one shown in FIG. 1, and in which the elements having like functions have been denoted by like reference characters. Compared with the diagram shown in FIG. 1, residual linearity errors have been compensated for by the insertion of several additional elements. The current mirrors M1 and M2 of FIG. 1 in their simplest form present a small error in the recopying of the input current, because the base current of the transistors 16 and 18 is tapped in the control branch without being recopied in the output branch. This error, for that matter, is smaller as the gain of the transistors used is higher and it may at least partially be compensated for in a manner known per se which consists of inserting current compensating resistors 51 and 52 between the emitters of the control transistors 15 and 17 arranged as diodes, and the terminal of the DC current source S which is opposite to the supply voltage reference terminal E. In the current mirrors M1 and M2, the output transistors 16 and 18 have their emitters directly connected to the current source S. Other solutions are also possible for improving the accuracy with which the input current of these mirrors can be recopied, but the indicated solution makes it possible to minimize the additional voltage inserted in the control branch of these current mirrors. The value of the compensating current resistors 51 and 52 is easily determined as a function of the maximum voltage swing provided for the differential circuit under consideration. As is known, such a compensation is not perfect because it does not apply an additional output current which is exactly proportional to the control current. A value is thus selected for the resistors 51 and 52 calculated to provide an exact compensation in the neighbourhood of the maximum current that can flow through the current mirrors, that is to say, the current supplied by the DC current source S, because for these values the error, as an absolute value, matters most.

A detailed analysis of the operation of the simple circuit represented in FIG. 1 also shows that a small degradation of the linearity of the output voltage is caused by the Early effect of the output transistors 16, 18 of the current mirrors M1 and M2. This residual error is compensated for in the circuit represented in FIG. 3 by means of a cascode stage comprising the additional transistors 111 and 112 whose bases are biased with the aid of a voltage shift relative to the current source S. This voltage shift is produced by two transistors arranged as diodes 61 and 62, connected in series and fed from the supply voltage terminal $V_{cc}$ with a given current which is limited, for example, by a resistor 63. The collectors of the transistors 111 and 112 feed the output loads constituted by the resistors 31, 32 and the junctions $J_1$ and $J_2$ and produce the output voltages $V_{01}$ and $V_{02}$ on the output terminals 41 and 42. Finally, the emitters of the transistors 111 and 112 are connected to the collectors of the transistors 16 and 18 of the outputs of the current mirrors M1 and M2, respectively. Thus, these transistors 16 and 18 operate with a practically constant potential $V_{ce}$ for the compensation of the Early effect. Because of the limited gains of the transistors 111 and 112, the currents flowing through the output loads 31, $J_1$, 32, $J_2$ are reduced by the base current values of said transistors. This very small error may even be compensated for by a slight increase of the resistance of the current compensating resistors 51 and 52. The performance of the differential circuit described with respect to FIG. 3 is improved relative to that described with respect to FIG. 1 because experience has disclosed a linearity better than 1/1000 of the output signal even when a voltage is applied in a non-symmetrical drive mode to the input of the circuit.

The circuits described by way of example present a high linearity which is desirable in an application for voltage measurement and, more specifically, for the conversion of analog signals into digital signals. In a simple structure, these circuits may be fed with relatively small currents, for example, 100 μA, while very good properties of the pass-band are maintained. Although the examples given by way of the drawing Figures present transistors of the NPN type, such circuits may alternatively be constituted by PNP transistors, but with polarity of the supply voltage inverted.

It should be obvious that variants of the embodiments disclosed may also be applied to the examples described and which are within the scope of the invention to be claimed hereinafter.

I claim:

1. A high linearity differential circuit, comprising: a DC current source feeding from a supply voltage reference terminal emitter-collector paths of a differential pair of input transistors, a collector of each of said input transistors being fed from another supply voltage terminal, a base of an input transistor receiving an input voltage signal and an emitter of each input transistor being connected to the DC current source via a respective emitter load resistor each of which has the value R, characterized in that a control branch of a current mirror comprising q forward biased junctions is connected between the emitter of each input transistor and the current source, in that an output branch of the current mirror is connected to said other supply voltage terminal via an output load resistor in series with a non-zero number k of forward biased junctions, and in that the value of each of the output load resistors is selected to be practically equal to k.R/(1+q) so as to obtain a voltage gain at the output, said gain being equal to k/(1+q) relative to the input voltage signal.

2. A differential circuit as claimed in claim 1, wherein a number p of forward biased junctions in series with the control branch of the current mirror are connected between the emitter of each input transistor and the current source, and wherein the value of each of the output load resistors is selected to be practically equal to k.R/(1+p+q) so as to produce at the output a voltage gain equal to k/(1+p+q).

3. A differential circuit as claimed in claim 2 wherein a current mirror has a single DC junction in its control branch (q=1).

4. A differential circuit as claimed in claim 2 wherein in each of the current mirrors said control branch comprises a control transistor arranged as a diode, an emitter of said control transistor being connected to the DC current source through a current compensating resistor, and the output branch of the current mirror comprises a transistor having an emitter directly connected to the DC current source.

5. A differential circuit as claimed in claim 4 wherein in each of the current mirrors said output branch comprises a cascode stage including an additional transistor having a base biased with a voltage shift determined relative to a node constituted by the DC current source and the current mirrors, wherein the additional transistor has a collector that feeds the output load resistor in series with the determined number k of junctions and has an emitter connected to the collector of the output branch transistor of the current mirror.

6. A differential circuit as claimed in claim 1 wherein a current mirror has a single DC junction in its control branch (q=1).

7. A differential circuit as claimed in claim 1 wherein in each of the current mirrors said control branch comprises a control transistor arranged as a diode, an emitter of said control transistor being connected to the DC current source through a current compensating resistor, and the output branch of the current mirror comprises a transistor having an emitter directly connected to the DC current source.

8. A differential circuit as claimed in claim 7 wherein in each of the current mirrors said output branch comprises a cascode stage including an additional transistor having a base biased with a voltage shift determined relative to a node constituted by the DC current source and the current mirrors, wherein the additional transistor has a collector that feeds the output load resistor in series with the determined number k of junctions and has an emitter connected to the collector of the output branch transistor of the current mirror.

9. A differential circuit as claimed in claim 2 wherein in each of the current mirrors said output branch comprises a cascode stage including an additional transistor having a base biased with a voltage shift determined relative to a node constituted by the DC current source and the current mirrors, wherein the additional transistor has a collector that feeds the output load resistor in series with the determined number k of junctions and has an emitter connected to the collector of the output branch transistor of the current mirror.

10. A differential circuit as claimed in claim 1 wherein in each of the current mirrors said output branch comprises a cascode stage including an additional transistor having a base biased with a voltage shift determined relative to a node constituted by the DC current source and the current mirrors, wherein the additional transistor has a collector that feeds the output load resistor in series with the determined number k of junctions and has an emitter connected to the collector of the output branch transistor of the current mirror.

11. A high linearity differential circuit comprising:
first and second supply terminals for connection to a source of supply voltage for the differential circuit,
a DC current source having a first terminal coupled to the second supply terminal,
a differential pair of input transistors each having a control electrode coupled to a respective signal input terminal,
first and second resistors each having a resistance value R,
first and second current mirrors each having a control branch including q forward biased rectifying junctions and an output branch including a load resistor in series with k forward biased rectifying junctions,
first means coupling respective ones of said pair of input transistors in respective first series circuits with respective ones of said first and second resistors and respective ones of the control branches of the current mirrors to said first supply terminal and to a second terminal of the DC current source, and
second means coupling the output branches of the current mirrors to said first supply terminal and to the second terminal of the DC current source, wherein
each of the load resistors has a resistance value of kR/(1+q) thereby to produce at the load resistors a voltage gain of k/(1+q) relative to an input voltage signal at the signal input terminals.

12. A differential circuit as claimed in claim 11 wherein,
each of said first series circuits further comprises p forward biased rectifying junctions, and wherein
each of the load resistors has a resistance of kR/(1+p+q) thereby to produce at the load resistors a voltage gain of k/(1+p+q).

13. A differential circuit as claimed in claim 11 wherein a rectifying junction in each control branch of the current mirrors comprises a diode-connected transistor coupled to the DC current source via a current compensating resistor and each output branch of the current mirrors comprises a transistor of the same type as said diode-connected transistor and which is directly connected to the DC current source.

14. A differential circuit as claimed in claim 11 wherein a rectifying junction in each control branch of the current mirrors comprises a diode-connected transistor coupled to the DC current source and each output branch of the current mirrors comprises a transistor directly connected to the DC current source and a further series connected transistor having a control electrode coupled to a circuit point of reference voltage at a voltage level that is shifted relative to a voltage at a node between the DC current source and the current mirrors.

15. A high linearity differential circuit comprising:
first and second supply terminals for connection to a source of supply voltage for the differential circuit,
a DC current source having a first terminal coupled to the second supply terminal, a differential pair of input transistors each having a control electrode coupled to a respective signal input terminal, first and second resistors each having a resistance value R, first and second current mirrors each having a control branch including q forward biased rectifying junctions and an output branch including a load resistor in series with k forward biased rectifying junctions, a first and second plurality p of forward biased rectifying junctions, first means coupling one of said pair of input transistors in a first series circuit with said first resistor, said first plurality p of forward biased rectifying junctions, and the control branch of the first current mirror to said first supply terminal and to a second terminal of the DC current source, second means coupling the other one of said pair of input transistors in a second series circuit with said second resistor, said second plurality p of forward biased rectifying junctions, and the control branch of the second current mirror to said first supply terminal and to the second terminal of the DC current source, third means coupling the output branches of the current mirrors in parallel to said first supply terminal and to the second terminal of the DC current source, wherein each of the load resistors has a resistance $kR/(1+p+q)$ thereby to produce at the load resistors a voltage gain of $k/(1+p+q)$ relative to an input voltage signal at the signal input terminals.

* * * * *